US008633557B2

(12) United States Patent
Kim et al.

(10) Patent No.: US 8,633,557 B2
(45) Date of Patent: Jan. 21, 2014

(54) IMAGE SENSORS

(75) Inventors: Sang-Hoon Kim, Seongnam-si (KR); Chang-Rok Moon, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 13/599,960

(22) Filed: Aug. 30, 2012

(65) Prior Publication Data

US 2013/0221465 A1    Aug. 29, 2013

(30) Foreign Application Priority Data

Feb. 29, 2012 (KR) .......................... 10-2012-0020926

(51) Int. Cl.
*H01L 31/0232* (2006.01)

(52) U.S. Cl.
USPC .................................. 257/432; 257/E31.127

(58) Field of Classification Search
USPC ................................... 257/414, 432, E31.127
See application file for complete search history.

(56) References Cited

U.S. PATENT DOCUMENTS

| 7,364,933 B2 | 4/2008 | Kim |
| 7,714,403 B2 | 5/2010 | Lee et al. |
| 2005/0104148 A1 | 5/2005 | Yamamoto et al. |
| 2011/0049330 A1 | 3/2011 | Adkisson et al. |
| 2011/0115002 A1 | 5/2011 | Tai et al. |
| 2011/0186951 A1 | 8/2011 | Pyo |
| 2011/0207258 A1 | 8/2011 | Ahn et al. |
| 2011/0223707 A1 | 9/2011 | Hynecek et al. |
| 2013/0020468 A1* | 1/2013 | Mitsuhashi et al. ....... 250/208.1 |

FOREIGN PATENT DOCUMENTS

| JP | 2009146957 A | 7/2009 |
| KR | 20100080224 A | 7/2010 |
| KR | 20100098916 A | 9/2010 |
| KR | 20110037481 A | 4/2011 |

* cited by examiner

*Primary Examiner* — Whitney T Moore
(74) *Attorney, Agent, or Firm* — Harness, Dickey & Pierce, P.L.C.

(57) ABSTRACT

Image sensors include a first insulation interlayer structure on a first surface of a substrate and having a multi-layered structure. A first wiring structure is in the first insulation interlayer structure. A via contact plug extends from a second surface of the substrate and penetrates the substrate to be electrically connected to the first wiring structure. Color filters and micro lenses are stacked on the second surface in a first region of the substrate. A second insulation interlayer structure is on the second surface in a second region of the substrate. A second wiring structure is in the second insulation interlayer structure to be electrically connected to the via contact plug. A pad pattern is electrically connected to the second wiring structure and having an upper surface through which an external electrical signal is applied. Photodiodes are between the first and second wiring structures in the first region.

20 Claims, 11 Drawing Sheets

IMAGE SENSORS

PRIORITY STATEMENT

This application claims priority under 35 U.S.C. §119 to Korean Patent Application No. 2012-20926, filed on Feb. 29, 2012 in the Korean Intellectual Property Office (KIPO), the entire contents of which are herein incorporated by reference.

BACKGROUND

1. Field

Example embodiments relate to image sensors. More particularly, example embodiments relate to image sensors having a backside illumination architecture.

2. Description of the Related Art

An image sensor may covert incident light into electrical signals. The image sensor may be divided into a charge coupled device (CCD) image sensor and a complementary metal-oxide semiconductor (CMOS) image sensor. Recently, in order to improve light efficiency and light sensitivity of unit pixels included in an image sensor, an image sensor having a backside illumination architecture where light is incident through a backside of a semiconductor substrate and converted into electrical signals may be used mainly.

SUMMARY

Example embodiments relate to image sensors. More particularly, example embodiments relate to image sensors having a backside illumination architecture.

Example embodiments provide image sensors having a simplified wiring structure.

According to example embodiments, an image sensor includes a first insulation interlayer structure on a first surface of a first substrate and having a multi-layered structure. A first wiring structure is in the first insulation interlayer structure. A via contact plug extends from a second surface of the first substrate opposite to the first surface and penetrates the first substrate to be electrically connected to the first wiring structure. A plurality of color filters and a plurality of micro lenses are stacked on the second surface in a first region of the first substrate. A second insulation interlayer structure is on the second surface in a second region of the first substrate. A second wiring structure is in the second insulation interlayer structure to be electrically connected to the via contact plug. A pad pattern is electrically connected to the second wiring structure and having an upper surface through which an external electrical signal is applied. A plurality of photodiodes are provided between the first and second wiring structures in the first region of the first substrate and corresponding to each of the plurality of micro lenses.

In example embodiments, the image sensor may further include a second substrate adhered to the first insulation interlayer structure to support the first insulation interlayer structure.

In example embodiments, the upper surface of the pad pattern may have a height the same as, or higher than, the uppermost surface of the second wiring structure.

In example embodiments, the pad pattern may contact a portion of the second wiring structure.

In example embodiments, the pad pattern may contact a portion of the via contact plug.

In example embodiments, the second wiring structure may include a plurality of single-layered or multi-layered metal wirings each including a contact plug and a wiring line.

In example embodiments, the image sensor may further include a plurality of transistors on the first surface of the first substrate, and the plurality of transistors may be electrically connected to the first wiring structure and constitute a plurality of first peripheral circuits and a plurality of image pixels.

In example embodiments, the image sensor may further include a plurality of additional transistors on the second surface in the second region of the first substrate, and the plurality of additional transistors may be electrically connected to the second wiring structure and constitute a plurality of second peripheral circuits.

In example embodiments, the first wiring structure may cover the entire first surface of the first substrate and may have a multi-layered structure.

According to example embodiments, an image sensor includes a first wiring structure on a first surface of a first substrate. A via contact plug extends from a second surface of the first substrate opposite to the first surface and penetrates the first substrate to be electrically connected to the first wiring structure. A plurality of color filters and a plurality of micro lenses are stacked on the second surface in a first region of the first substrate. A second wiring structure is on the second surface in a second region of the first substrate to be electrically connected to the via contact plug. A pad pattern is electrically connected to the second wiring structure and has an upper surface through which an external electrical signal is applied. A plurality of photodiodes is between the first and second wiring structures in the first region of the first substrate.

In example embodiments, the first wiring structure may be covered with a first insulation interlayer structure and the second wiring structure may be covered with a second insulation interlayer structure.

In example embodiments, the second wiring structure may include a plurality of multi-layered metal wirings each including a contact plug and a wiring line, and the pad pattern may contact at least a portion of the second wiring structure.

In example embodiments, the second wiring structure may include a single-layered metal wiring having a wiring line, and the single-layered metal wiring may be arranged coplanar with the pad pattern.

In example embodiments, at least a portion of the single-layered metal wiring may contact the via contact plug.

In example embodiments, the image sensor may further include a plurality transistors each on the first surface or the second surface of the first substrate.

According to example embodiments, an image sensor includes a first wiring structure on a first surface of a substrate. A via contact plug extends through the substrate and is electrically connected to the first wiring structure. A plurality of color filters and a plurality of micro lenses are stacked on a second surface in an active pixel region over the substrate. The second surface opposes the first surface. A second wiring structure is on the second surface and is electrically connected to the via contact plug. The second wiring structure is in a region over the substrate excluding the active pixel region. A pad pattern is electrically connected to the second wiring structure and has an upper surface through which an external electrical signal is applied. A plurality of photodiodes is between the first and second wiring structures in the active pixel region.

The image sensor may further include a plurality of the via contact plugs each contacting either the pad pattern or the second wiring structure.

The image sensor may further include at least one transistor on the second surface in the region over the substrate excluding the active pixel region, wherein the at least one transistor is electrically connected to the second wiring structure.

The image sensor may further include a plurality of insulation interlayers stacked on the second surface in the region over the substrate excluding the active pixel region, wherein the second wiring structure includes a plurality of wiring lines each being in one of the plurality of insulation interlayers.

The image sensor may further include at least transistor on the second surface in the region over the substrate excluding the active pixel region, wherein the at least one transistor is electrically connected to the second wiring structure, and the at least one transistor and the via contact plug are covered by a first insulation interlayer selected from the plurality of insulation interlayers.

According to example embodiments, an image sensor may include wiring structures that are provided on a first surface such as a front side and a second surface such as a backside, respectively. That is, the wiring structures may be provided on the incident surface as well as the opposite surface. Accordingly, the wiring structure of the wirings may be simplified, and a failure that occurs when the wiring structures is formed may be prevented.

BRIEF DESCRIPTION OF THE DRAWINGS

Example embodiments will be more clearly understood from the following detailed description taken in conjunction with the accompanying drawings. FIGS. 1 to 10 represent non-limiting, example embodiments as described herein.

FIG. 1 is a circuit diagram illustrating a complementary metal-oxide semiconductor (CMOS) image sensor (CIS).

FIG. 2 is a cross-sectional view illustrating an image sensor having a backside illumination architecture in accordance with example embodiments.

FIG. 4 is a cross-sectional view illustrating an image sensor having a backside illumination architecture in accordance with example embodiments.

FIG. 6 is a cross-sectional view illustrating an image sensor having a backside illumination architecture in accordance with example embodiments.

FIG. 7 is a cross-sectional view illustrating a method of manufacturing the image sensor having a backside illumination architecture in FIG. 6.

FIG. 8 is a cross-sectional view illustrating an image sensor having a backside illumination architecture in accordance with example embodiments.

FIG. 9 is a cross-sectional view illustrating a method of manufacturing the image sensor having a backside illumination architecture in FIG. 8.

FIG. 10 is a block diagram illustrating a system including an image sensor in accordance with example embodiments.

DETAILED DESCRIPTION OF EXAMPLE EMBODIMENTS

Figure 1:
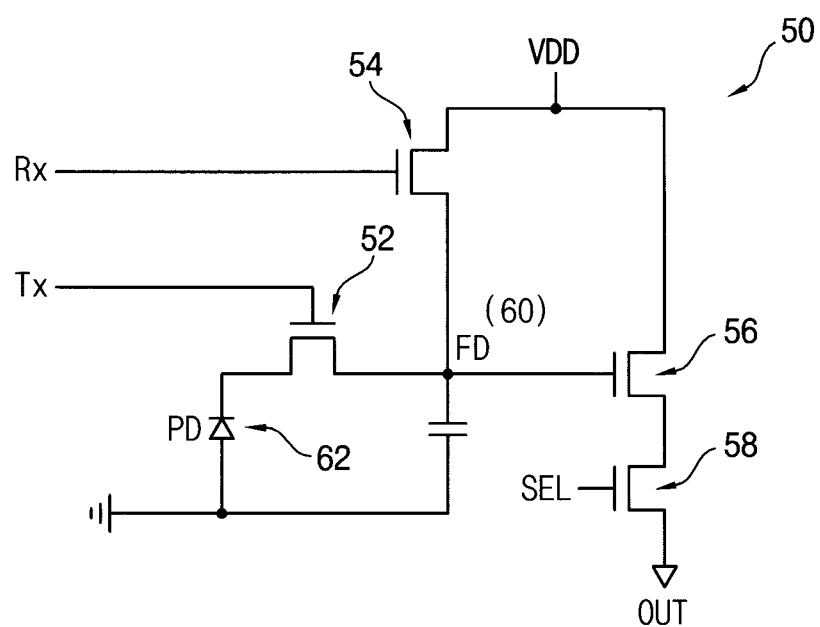

Various example embodiments will be described more fully hereinafter with reference to the accompanying drawings, in which example embodiments are shown. Example embodiments may, however, be embodied in many different forms and should not be construed as limited to example embodiments set forth herein. Rather, these example embodiments are provided so that this disclosure will be thorough and complete, and will fully convey the scope of example embodiments to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Example embodiments relate to image sensors. More particularly, example embodiments relate to image sensors having a backside illumination architecture.

FIG. 1 is a circuit diagram illustrating a complementary metal-oxide semiconductor (CMOS) image sensor (CIS).

Referring to FIG. 1, each unit pixel may be provided in an active pixel region.

The unit pixel may include a photodiode (PD) 62 configured for detecting light, a transmission transistor 52 configured for transmitting photons focused in the photodiode into a floating diffusion region (FD) 60, a reset transistor 54 configured for resetting the floating diffusion region (FD), a drive transistor 56 configured for generating electrical signal corresponding to the photons transmitted into the floating diffusion region (FD) and a selection transistor 58 configured for transferring the electrical signal from the unit pixel to the outside.

The transmission transistor 52 may be controlled by a transmission control signal (Tx), the reset transistor 54 may be controlled by a reset control signal (Rx), and the selection transistor 58 may be controlled by a selection control signal (SEL). The CMOS image sensor may have a backside illumination architecture.

In the CIS having a backside illumination architecture, wirings may not be formed on an incident surface of the active pixel region. Accordingly, the CIS having a backside illumination architecture may receive light through the whole (or the entire) active pixel region, to thereby have excellent light efficiency.

Figure 2:
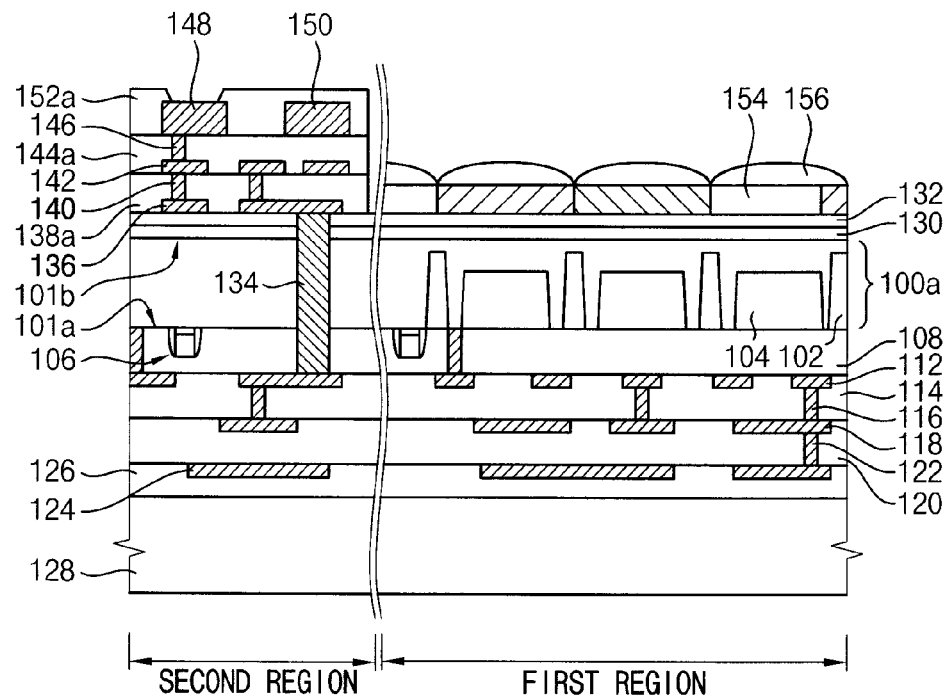

FIG. 2 is a cross-sectional view illustrating an image sensor having a backside illumination architecture in accordance with example embodiments.

Referring to FIG. 2, an image sensor having a backside illumination architecture may include photodiodes 104 in a first substrate 100a. Color filters 154, micro lenses 156, a second insulation interlayer structure and a second wiring structure may be provided on a second surface 101b such as a backside of the first substrate 100a. Transistors 106 may be provided on a first surface 101a of the first substrate 100a. A first insulation interlayer structure and a first wiring structure may be provided on the first surface 101a of the first substrate 100a. A via contact plug 134 may be provided to penetrate (or extend through) the first substrate 100a to electrically connect the first and second wiring structures. A pad pattern 148 may be provided to be electrically connected to the second wiring structure. An external electrical signal may be applied through an exposed upper surface of the pad pattern.

The first substrate 100a may include a semiconductor substrate. In example embodiments, a SOI substrate may not be required for the first substrate 100a. A single-crystalline silicon substrate may be used for the first substrate 100a. The via contact plug 134 may penetrate the first substrate 100a. Accordingly, the first substrate 100a may have a relatively small thickness. For example, the first substrate 100a may have a thickness of several to tens of micrometers.

The first substrate 100a may have the first surface 101a such as a front side and the second surface 101b such as a backside opposite to the first surface 101a. Light may be irradiated onto the second surface 101b. The first substrate 100a may include a first region and a second region. For example, the first region may be provided for an active pixel region, and the second region may be provided for a peripheral region.

The photodiodes 104 may be provided in the first substrate 100a. The photodiodes 104 may be provided nearer to the second surface 101b than the first surface 101a of the first substrate 100a, or vice versa. Each photodiode 104 may constitute each unit pixel. As illustrated in the figure, the photodiodes 104 may be provided between the first and second wiring structures.

The color filter 154 and the micro lens 156 may be provided on the second surface 101b in the first region of the first substrate 100a. The first color filter 154 and the micro lens 156 may be provided corresponding to the photodiode 104. Light may be incident into the photodiode 104 through the color filter 154 and the micro lens 156.

An anti-reflective layer 130 may be provided between the color filters 154 and the second surface 101b of the first substrate 100a. The anti-reflective layer 130 may have a thickness of about 500 to about 1500 Å. Devices (e.g., a wiring structure or a transistor) may not be provided between the color filters 154 and the second surface 101b of the first substrate 100a. Accordingly, the distance of light moving between the micro lens 156 and the photodiode 104 may be decreased to prevent diffused reflection and blocking of light due to the wiring structure or the transistors, to thereby improve light efficiency and light sensitivity.

A transmission transistor, a reset transistor, a conversion transistor and a selection transistor included in a unit pixel may be provided on the first surface 101a in the first region of the first substrate 100a. Transistors for peripheral circuits may be provided on the first surface 101a in the second region of the first substrate 100a.

The first insulation interlayer structure may be provided to cover the first surface 101a of the first substrate 100a. The first wiring structure may be provided in the first insulation interlayer structure. As illustrated in the figure, the photodiodes 104 may be provided on the first insulation interlayer structure and the first wiring structure.

The first insulation interlayer structure may include multi-layered insulation interlayers. For example, the first insulation interlayer structure may include first to fourth insulation interlayers 108, 114, 120, 126. The first to fourth insulation interlayers 108, 114, 120, 126 may include silicon oxide.

The first wiring structure may include multi-layered contact plugs and wiring lines. The contact plug and the wiring line may include metal. As illustrated in the figure, the first wiring structure may include three-layered contact plugs and wiring lines.

The first wiring structure may be provided on the first surface 101a of the first substrate 100a opposite to the incident surface onto which light is irradiated. The first insulation interlayer structure may not affect light efficiency and light sensitivity. Therefore, the first insulation interlayer structure may be arranged without consideration of the positions of the photodiodes 104. Additionally, the first insulation interlayer structure may be arranged on the whole (or entire) first surface 101a of the first substrate 100a.

A second substrate 128 may be adhered to the first insulation interlayer structure to support the first insulation interlayer structure.

The via contact plug 134 may extend from the second surface 101b of the first substrate 100a to penetrate (or extend through) the first substrate 100a to be connected to the first wiring structure. The via contact plug 134 may make contact with a portion of the first wiring structure, to be electrically connected to the first wiring structure. The via contact plug 134 may include metal. The via contact plug 134 may penetrate the second region of the first substrate 100a.

The second insulation interlayer structure may be provided to cover the second surface 101b in the second region of the first substrate 100a. The second wiring structure may be provided in the second insulation interlayer structure, to be electrically connected to the via contact plug 134.

The second insulation interlayer structure may include multi-layered insulation interlayer patterns. For example, the second insulation interlayer structure may include fifth to seventh insulation interlayer patterns 138a, 144a, 152a. The fifth to seventh insulation interlayer patterns 138a, 144a, 152a may include silicon oxide.

The second wiring structure may include multi-layered contact plugs and wiring lines. The contact plug and the wiring line may include metal. As illustrated in the figure, the second wiring structure may include two-layered contact plugs and wiring lines.

As mentioned above, the second insulation interlayer structure and the second wiring structure may be provided in the second region of the first substrate 100a. Accordingly, the second insulation interlayer structure and the second wiring structure may not affect light efficiency and light sensitivity of the unit pixels that are provided in the first region of the first substrate 100a.

The second wiring structures may be electrically connected to the first wiring structures. Accordingly, the stacked number of the metal wirings of the first wiring structure may be decreased when compared with the structure that does not include the second wiring structures. Because the first and second wiring structures are provided on the first surface 101a and the second surface 101b respectively, the wiring structure of the first wiring structure may be simplified and a failure that occurs when the first wiring structure is formed may be prevented.

The pad pattern 148 may be electrically connected to the second wiring structure. The pad pattern 148 may have the same height as the uppermost surface of the second wiring structure. Alternatively, the pad pattern 148 may have a height higher than the uppermost surface of the second wiring structure.

The pad pattern 148 may make contact with a portion of the second wiring structure to be electrically connected to the second wiring structure. However, the pad pattern 148 may not make contact with the via contact plug 134. The pad pattern 148 may include a metal material.

The pad pattern 148 may be used as a terminal electrode to which an external electrical signal is applied. The upper surface of the pad pattern may not be covered with the second insulation interlayer structure.

As mentioned above, the image sensor according to example embodiments may include the wiring structure respectively provided on the first and second surfaces 101a, 101b and the photodiodes 104 in the first substrate 100a between the wiring structures, to thereby simplify the wiring structure of the image sensor.

FIGS. 3A to 3H are cross-sectional views illustrating a method of manufacturing the image sensor having a backside illumination architecture in FIG. 2.

Figure 3A:
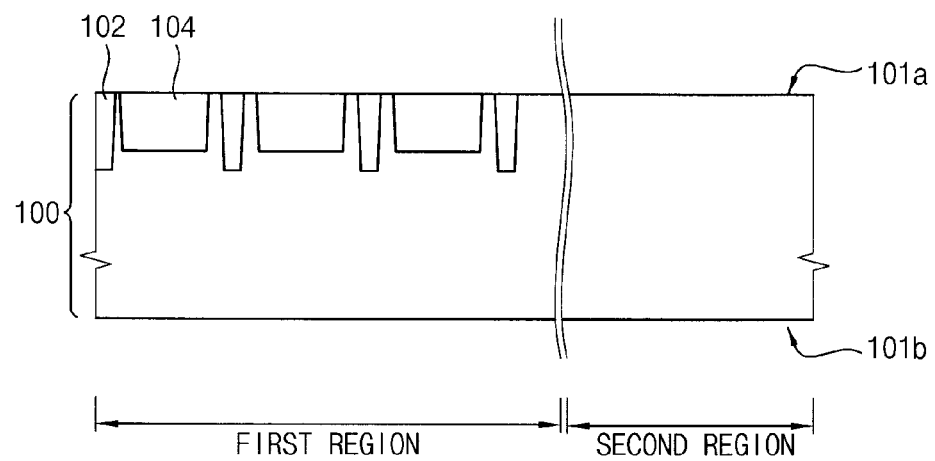
FIGS. 3A to 3H are cross-sectional views illustrating a method of manufacturing the image sensor having a backside illumination architecture in FIG. 2.

Referring to FIG. 3A, a first preliminary substrate 100 having a semiconductor material may be provided to include a first region and a second region. For example, the first region may be provided for an active pixel region, and the second region may be provided for a peripheral region where peripheral circuits are formed. The first preliminary substrate 100 may have a first surface 101a such as a front side and a second surface 101b such as a backside opposite to the first surface 101a. A wiring process may be performed on the first surface 101a of the first preliminary substrate 100.

Isolation layer patterns 102 may be formed in the first surface 101a of the first preliminary substrate 100 to define an active region and an isolation region. For example, a shallow trench isolation process may be performed to form trenches in the first preliminary substrate 100 and then fill up the trenches with an isolation material to form the isolation layer patterns 102.

Photodiodes 104 may be formed under the first surface 101a of the first preliminary substrate 100. Several ion implantation processes may be performed using a plurality of ion implantation masks to form the photodiodes 104. For example, an N-type impurity region and a P-type impurity region may be sequentially implanted adjacent to the first surface of the first preliminary substrate 100 to form a first photodiode having P-N junction, and a P-type impurity region and an N-type impurity region may be sequentially implanted to form a second photodiode having a N-P junction.

Figure 3B:
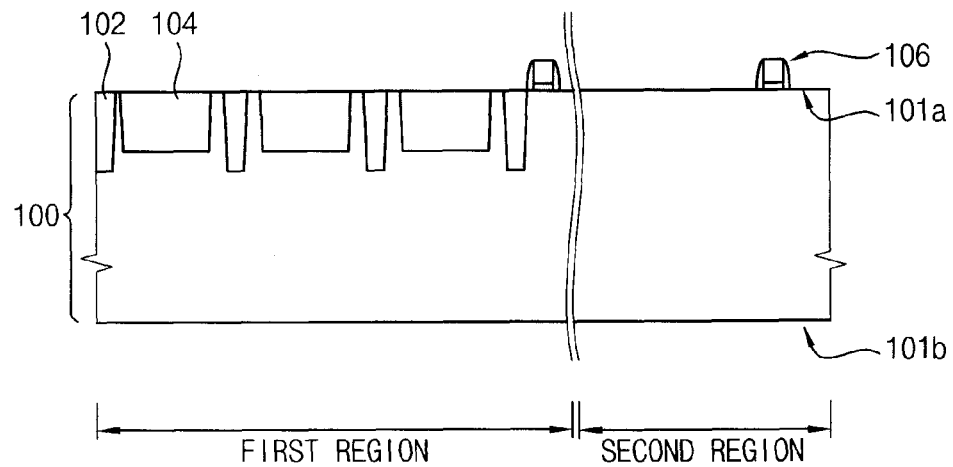

Referring to FIG. 3B, a gate insulation layer and a gate conductive layer may be formed on first surface of the first preliminary substrate 100 and then patterned to form a gate electrode. Impurity regions may be formed in both sides of the gate electrode to form a transistor 106. The transistor 106 formed in the first region of the first preliminary substrate 100 may include a transmission transistor, a reset transistor, a conversion transistor, a selection transistor, etc. The transistor 106 formed in the second region of the first preliminary substrate 100 may be provided to constitute the peripheral circuit.

In the present example embodiments, after forming the photodiode 104, the transistor 106 may be formed in the substrate, however, the order of forming the photodiode 104 and the transistor 106 may not be limited thereto. The above processes may be performed to form transistors to be required to constitute the circuits of an image sensor.

Figure 3C:
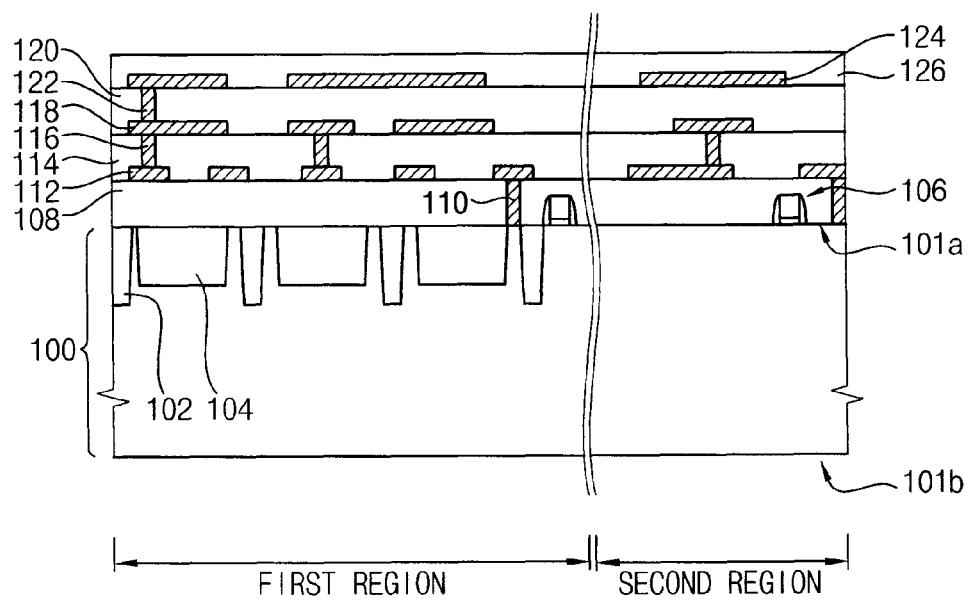

Referring to FIG. 3C, a first insulation interlayer 108 may be formed to cover the transistors 106. A first contact hole may be formed to penetrate the first insulation interlayer 108 and then may be filled with a conductive material form a first contact plugs 110. The conductive material may include metal or metal alloy. Examples of the conductive material may be copper (Cu), platinum (Pt), tungsten (W), aluminum (Al). These may be used alone or in a combination thereof. Further, a barrier metal layer may be formed to prevent diffusion of the metal material.

First wiring lines 112 may be formed to make contact with the first contact plug 110. The first wiring line 112 may be formed using metal or metal alloy. The first wiring lines 112 may be formed by a conductive layer deposition and patterning process. Alternatively, after a mold pattern is formed, an opening of the mold pattern may be filled with a conductive material to form the first wiring lines 112.

Then, a second insulation interlayer 114 may be formed, and then, a second contact plug 116 penetrating the second insulation interlayer 114 and second wiring lines 118 may be formed. The second contact plug 116 and the second wiring lines 118 may be formed by the same processes as the processes of forming the first contact hole 110 and the first wiring line 112.

As illustrated in the figure, a third insulation interlayer 120 may be formed, and then, a third contact plug 122 penetrating the third insulation interlayer 120 and the third wiring lines 124 may be formed. Then, a fourth insulation interlayer 126 may be formed to cover the third contact plug 122 and the third wiring line 124. A planarization process may be performed on the uppermost fourth insulation interlayer 126 to have a flat upper surface.

The above processes may be performed to form a first insulation interlayer structure including multi-layered insulation layers. A first wiring structure including multi-layered wiring layers may be formed in the first insulation interlayer structure.

The multi-layered number and the structure of the wiring lines and the contact plugs may not be limited thereto, but applied to have various numbers and structures that result, for example, from designing of circuit. The above processes may be performed to form some of wirings to be required to constitute the circuits of an image sensor.

Figure 3D:
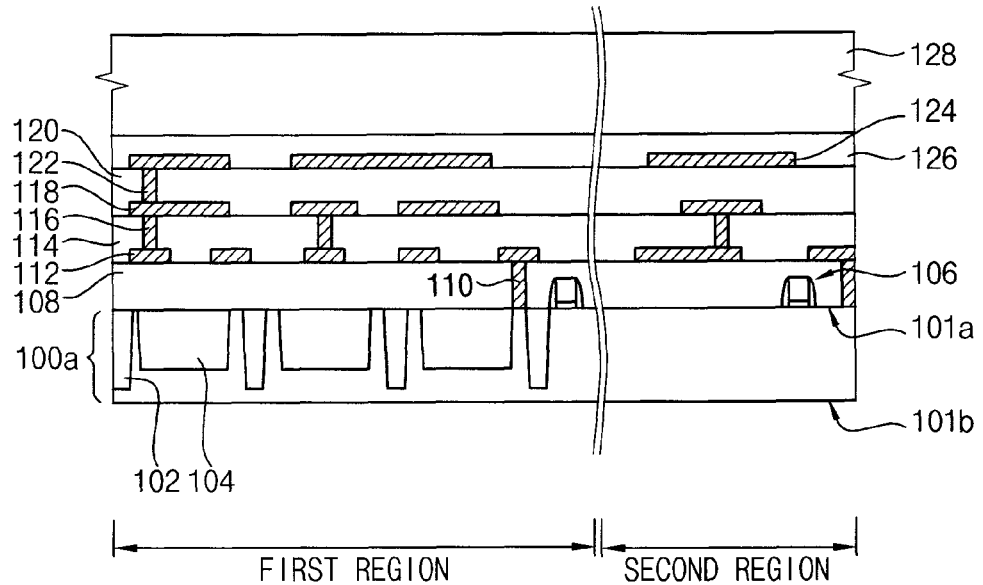

Referring to FIG. 3D, a second substrate 128 may be adhered to the first insulation interlayer structure to support the first insulation interlayer structure.

Then, the second surface of the first preliminary substrate 100 may be grinded such that the thickness of the first preliminary substrate 100 may be decreased to form a first substrate 100a having a thickness of several micrometers.

Following processes will be performed on the second surface 101b such as the backside of the first substrate 100a.

Figure 3E:
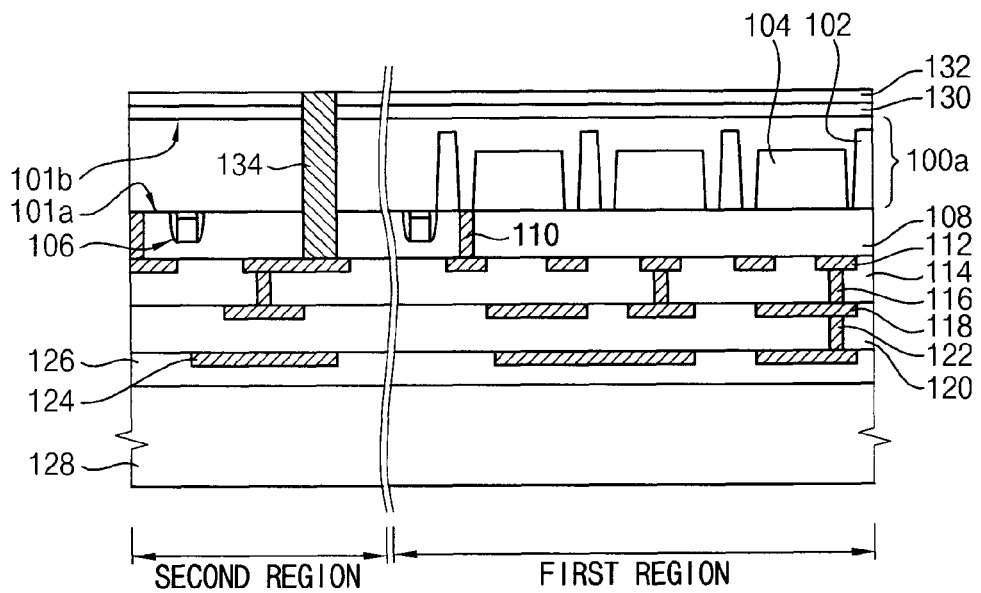

Referring to FIG. 3E, an anti-reflective layer 130 and an etch buffer layer 132 may be formed on the second surface 101b of the first substrate 100a. The anti-reflective layer 130 and the etch buffer layer 132 may be formed using an oxide having high transmittance. The anti-reflective layer 130 and the etch buffer layer 132 may be formed using an oxide having different etch selectivity with respect to each other. The anti-reflective layer 130 and the etch buffer layer 132 may be formed to have a thickness of about 1500 Å, respectively.

An etch mask pattern (not illustrated) for forming a through hole may be formed on the etch buffer layer 132 in the second region of the first substrate 100a. The etch buffer layer 132, the anti-reflective layer 130, the first substrate 100a and the first insulation interlayer structure may be partially etched using the etch mask pattern to form a through hole that exposes the first wiring structure.

The through hole may be filled with a conductive material to form a via contact plug 134. The conductive material may include a metal or a metal alloy. Examples of the conductive material may be copper (Cu), platinum (Pt), tungsten (W), aluminum (Al). These may be used alone or in a combination thereof. Further, a barrier metal layer may be formed to prevent diffusion of the metal material.

Figure 3F:
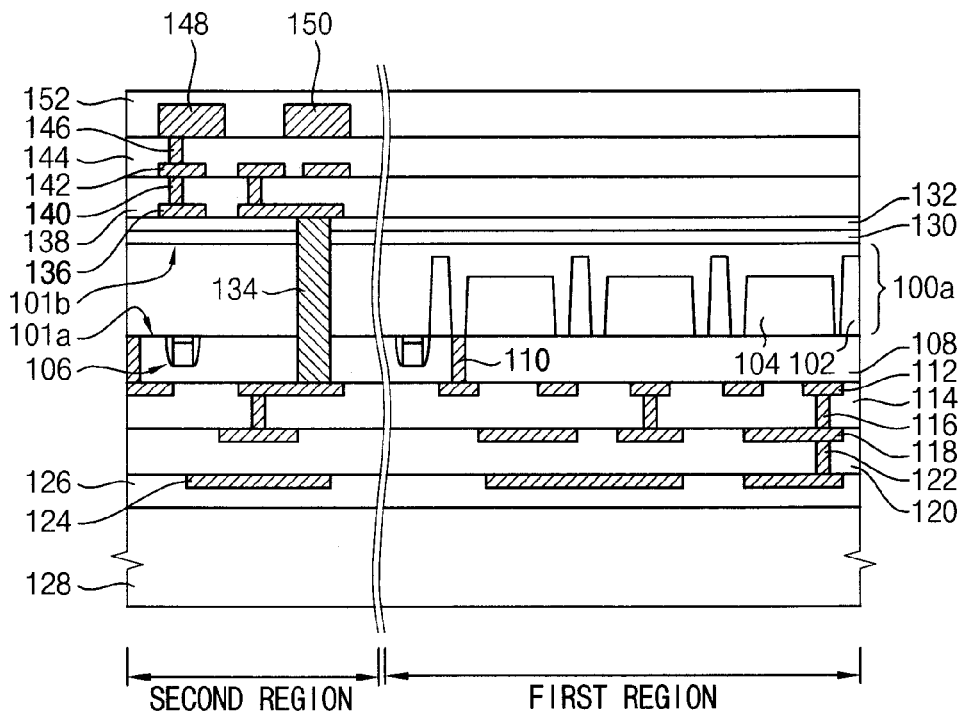

Referring to FIG. 3F, first upper wiring lines 136 may be formed on the second surface of the first substrate 100a to be electrically connected to the via contact plug 134.

A fifth insulation interlayer 138 may be formed to cover the first upper wiring lines 136. A contact hole may be formed to penetrate the fifth insulation interlayer 138 and filled with a conductive material to form upper contact plugs 140. The conductive material may include a metal or a metal alloy. Examples of the conductive material may be copper (Cu), platinum (Pt), tungsten (W), aluminum (Al). These may be used alone or in a combination thereof. Further, a barrier metal layer may be formed to prevent diffusion of the metal material.

Second upper wiring lines 142 may be formed to make contact with the first upper contact plugs 136. The second upper wiring lines 142 may be formed using metal or metal alloy.

Then, a sixth insulation interlayer 144 may be formed and then second contact plugs 146 may be formed to penetrate the sixth insulation interlayer 144. A third upper wiring line 150 and pad patterns 148 may be formed to be electrically connected to the second upper contact plugs 146. The pad pattern 148 may be used as a terminal electrode to which an external electrical signal is applied. Although it is not illustrated in the figure, only the pad patterns 148 may be formed on the sixth insulation interlayer 144.

In the present example embodiments, the upper wiring lines and the upper contact plugs may have a multi-layered structure, however, the multi-layered number and the structure of the upper wiring lines and the upper contact plugs may not be limited thereto.

The upper wiring lines, the upper contact plugs and the pad patterns may be formed on the second surface 101b in the second region of the first substrate 100a. That is, the upper wiring lines, the upper contact plugs and the pad patterns may not affect unit pixels that are formed in the active pixel region. A seventh insulation interlayer 152 may be formed to cover the third upper wiring lines 150 and the pad pattern 148.

The above process may be performed to form a second preliminary insulation interlayer structure including the fifth to seventh insulation interlayers 138, 144, 152, and a second wiring structure including the first to third upper wiring lines 136, 142, 150.

Figure 3G:
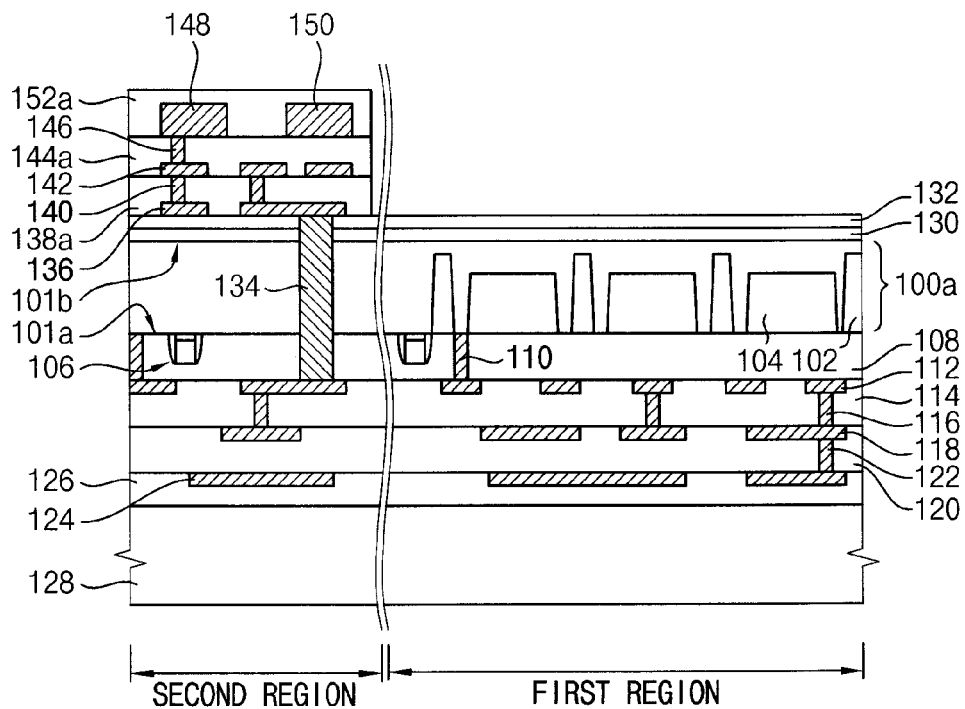

Referring to FIG. 3G, an etch mask pattern (not illustrated) may be formed on the seventh insulation interlayer 152 to expose the first region of the first substrate 100a. An etching process may be performed to remove the insulation interlayers in the first region of the first substrate 100a until the etch buffer layer 132 is exposed.

The above processes may be performed to form a second insulation interlayer structure including the fifth to seventh insulation interlayer patterns 138a, 144a, 152a in the second region of the first substrate 100a.

Although it is not illustrated in the figure, an additional process may be performed to selectively remove the etch buffer layer 132 in the first region of the first substrate 100a.

Figure 3H:
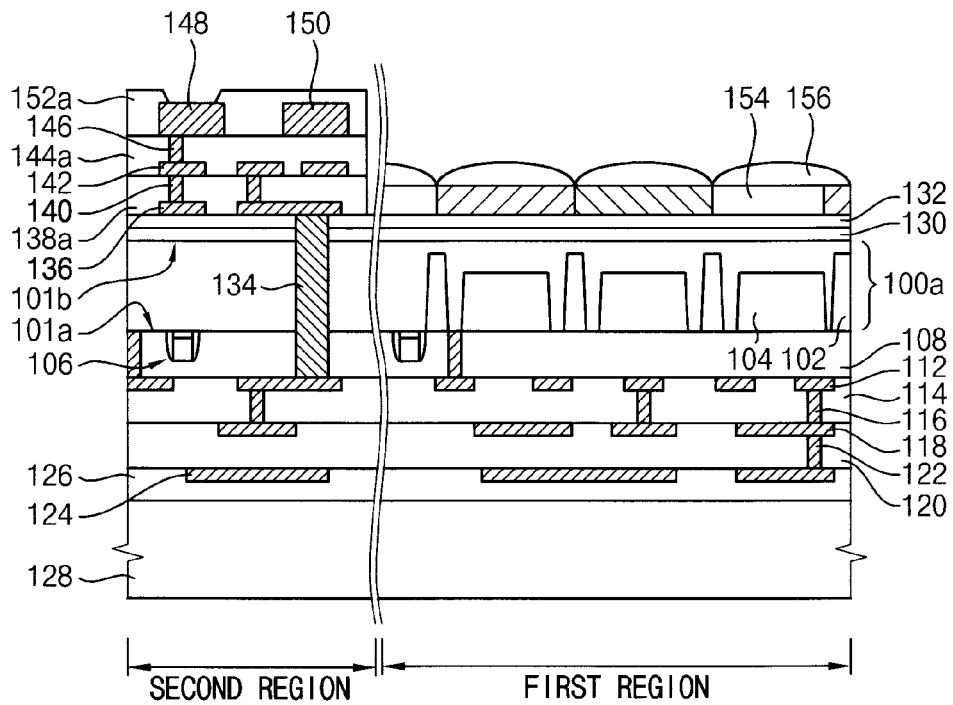

Referring to FIG. 3H, a color filter 154 and a micro lens 156 may be sequentially formed in the first region of the first substrate 100a. In this case, a planarization layer (not illustrated) such as an over-coating layer may be formed between the color filter 154 and the micro lens 156. The planarization layer may be formed using an organic material. In addition, the seventh insulation interlayer pattern 152a may be partially removed to expose an upper surface of the pad pattern 148.

Thus, wiring structures may be formed on the second surface 101b in the second region of the first substrate 100a. Therefore, the number of the wiring structures to be stacked on the first surface 101a of the first substrate 100a may be reduced, to thereby prevent a failure that occurs when the wiring structures are formed.

Figure 4:
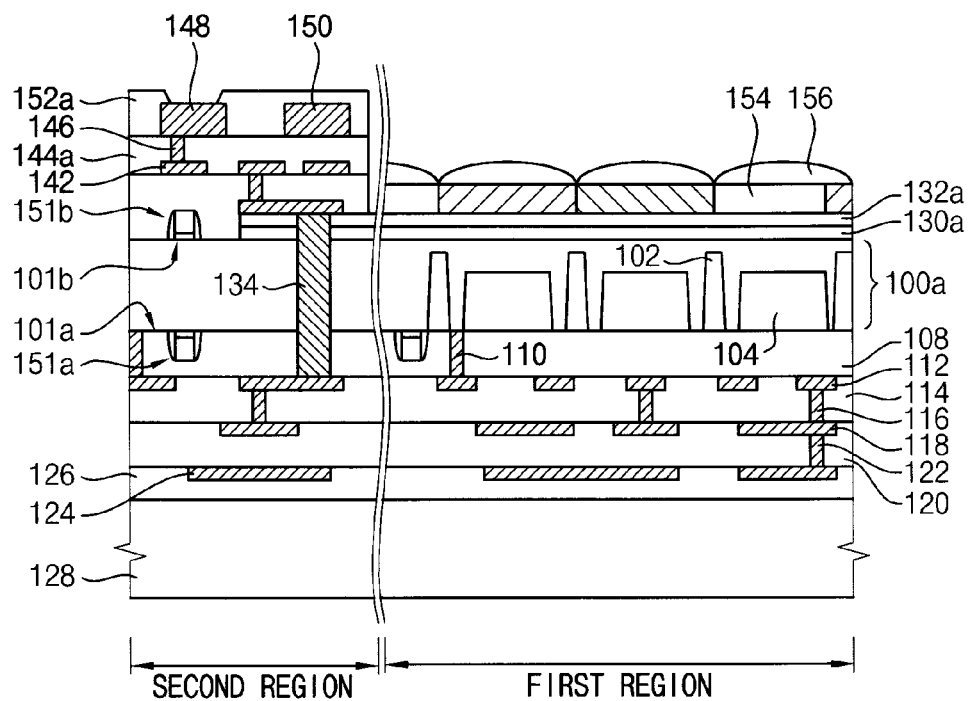

FIG. 4 is a cross-sectional view illustrating an image sensor having a backside illumination architecture in accordance with example embodiments.

The image sensor of the present example embodiments may be substantially the same as the previously described example embodiments, except for an arrangement of transistors for peripheral circuits.

Referring to FIG. 4, an image sensor having a backside illumination architecture may include photodiodes 104 in a first substrate 100a. Color filters 154, micro lenses 156, a second insulation interlayer structure and a second wiring structure may be provided on a second surface 101b such as a backside of the first substrate 100a. A first insulation interlayer structure and a first wiring structure may be provided on a first surface 101a of the first substrate 100a. Transistors may be provided on the first surface 101a and the second surface 101b of the first substrate 100a, respectively. A via contact plug 134 may be provided to penetrate (or extend through) the first substrate 100a to electrically connect the first and second wiring structures. A pad pattern 148 may be provided to be electrically connected to the second wiring structure. An external electrical signal may be applied through an exposed upper surface of the pad pattern. The photodiodes 104, the color filters 154 and the micro lenses 156 may be substantially the same as previously described in FIGS. 1, 2 and 3A-3H. As illustrated in the figure, the photodiodes 104 may be provided between the first and second wiring structures.

An anti-reflective layer pattern 130a and an etch buffer layer pattern 132a may be provided on the second surface 101b of the first substrate 100a.

A transmission transistor, a reset transistor, a conversion transistor and a selection transistor included in a unit pixel may be provided on the first surface 101a in the first region of the first substrate 100a. First transistors 151a for peripheral circuits may be provided on the first surface 101a in the second region of the first substrate 100a.

The first insulation interlayer structure may be provided to cover the first surface 101a of the first substrate 100a. The first wiring structure may be provided in the first insulation interlayer structure. As illustrated in the figure, the photodiodes 104 may be provided on the first insulation interlayer structure and the first wiring structure.

A second substrate 128 may be adhered to the first insulation interlayer structure to support the first insulation interlayer structure.

The transistors may not be provided on the second surface in the first region of the first substrate 100a. Second transistors 151b for peripheral circuits may be provided on the second surface 101b in the second region of the first substrate 100a.

The via contact plug 134 may extend from the second surface 101b of the first substrate 100a to penetrate the first substrate 100a to be connected to the first wiring structure. The via contact plug 134 may penetrate the second region of the first substrate 100a.

As mentioned above, the transistors for peripheral circuits may be provided on the first and second surfaces 101a, 101b of the first substrate 100a, respectively. The transistors may not be provided on the second surface 101b of the first region of the first substrate 100a.

The second insulation interlayer structure may be provided to cover the second surface 101b in the second region of the first substrate 100a. The second wiring structure may be provided in the second insulation interlayer structure, to be electrically connected to the via contact plug 134.

The pad pattern 148 may be electrically connected to the second wiring structure. The pad pattern 148 may make contact with a portion of the second wiring structure to be electrically connected to the second wiring structure.

In the present example embodiments, the image sensor may include the transistors provided on the second surface 101b of the first substrate 100a. Accordingly, an area for the wirings to be formed may be increased to thereby simplify layout design.

Figure 5A:
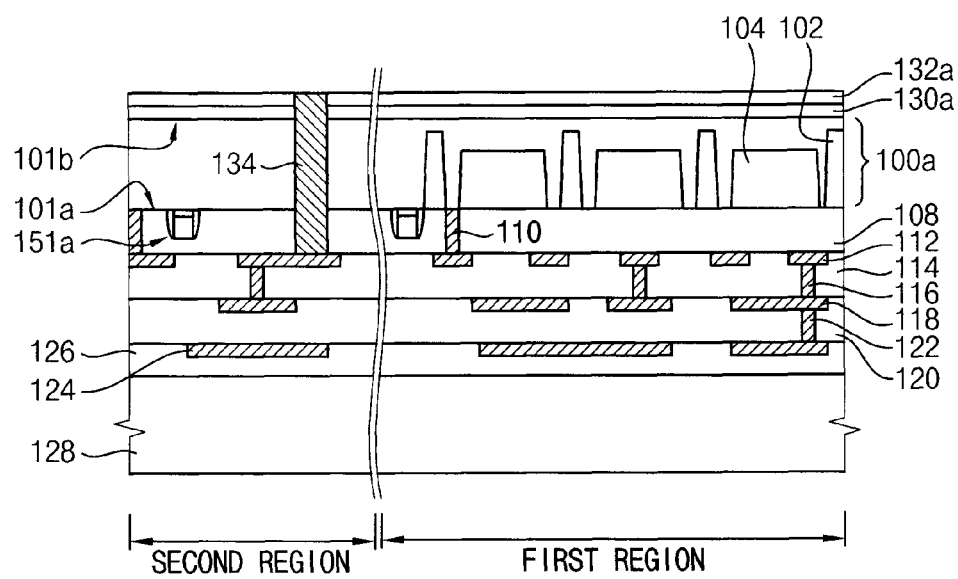
FIGS. 5A to 5C are cross-sectional views illustrating a method of manufacturing the image sensor having a backside illumination architecture in FIG. 4.
Figure 5B:
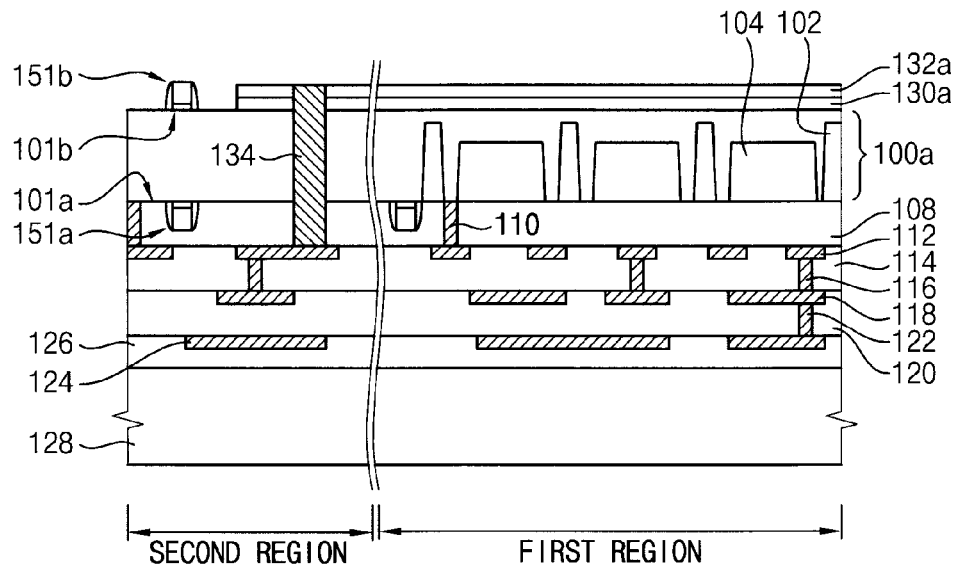
Figure 5C:
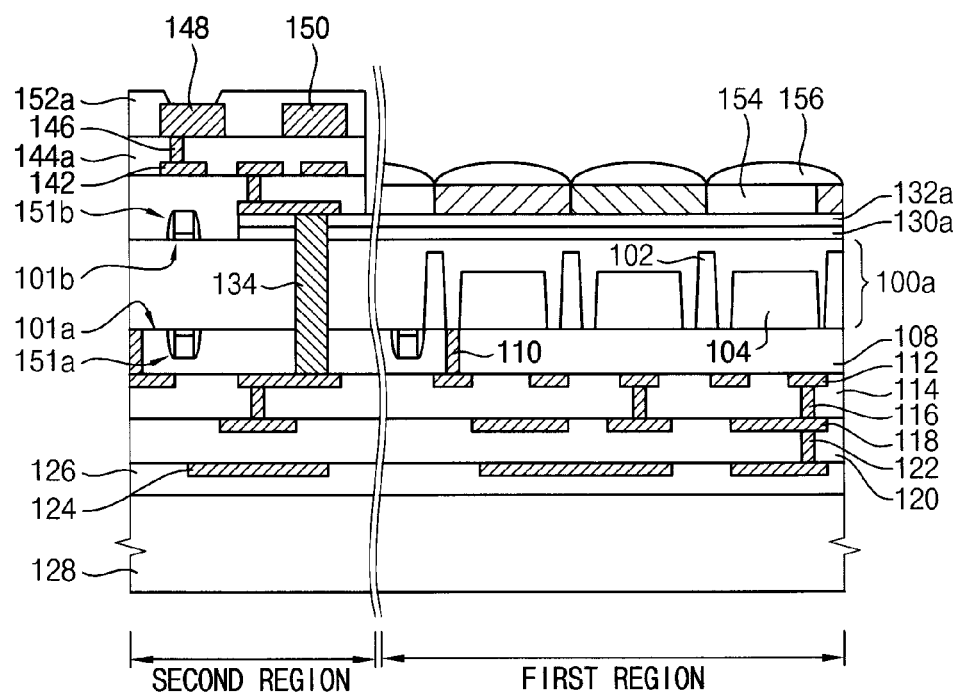

FIGS. 5A to 5C are cross-sectional views illustrating a method of manufacturing the image sensor having a backside illumination architecture in FIG. 4.

First, processes the same as described with reference to FIGS. 3A and 3B may be performed to form the structure in FIG. 3B. Accordingly, a first transistor (151a, see FIG. 5A) for forming a peripheral circuit may be formed in the second region of the first preliminary substrate. Transistors for forming each unit cell may be formed in the first region of the first preliminary substrate.

Referring to FIG. 5A, a first insulation interlayer structure may be formed on the second surface of the first preliminary substrate. A first wiring structure including wiring lines may be formed in the first insulation interlayer structure.

A second substrate 128 may be adhered to the first insulation interlayer structure to support the first insulation interlayer structure. Then, the second surface 101b of the first preliminary substrate 100 may be grinded such that the thickness of the first preliminary substrate 100 may be decreased to form a first substrate 100a having a thickness of several micrometers.

Then, an anti-reflective layer 130 and an etch buffer layer 132 may be formed on the second surface 101b of the first substrate 100a. The substrate 100a and the first insulation interlayer structure may be partially etched to form a through hole that exposes the first wiring structure. The through hole may be filled with a conductive material to form a via contact plug 134 that is electrically connected to the first wiring structure. The above processes may be substantially the same as described with reference to FIGS. 3C and 3D.

Referring to FIG. 5B, the anti-reflective layer 130 and the etch buffer layer 132 on the second surface 101b in the second region of the first substrate 100a may be removed to form an anti-reflective layer pattern 130a and an etch buffer layer pattern 132a.

A gate insulation layer and a gate conductive layer may be formed on the second surface 101b of the first substrate 100a, and then patterned to form gate electrode. Accordingly, the gate electrode may be formed on the second surface 101b in the second region of the first substrate 100a. Impurity regions may be formed in both sides of the gate electrode to form a second transistor 151b. The second transistor may be provided to constitute a peripheral circuit.

Thus, the transistors for peripheral circuits may be formed on the first and second surfaces 101a, 101b of the first substrate 100a, respectively.

Referring to FIG. 5C, a second insulation interlayer structure and a second wiring structure may be formed on the second surface 101b in the second region of the first substrate 100a. A pad pattern 148 may be formed to have an exposed upper surface.

Processes for forming the second insulation interlayer structure, the second wiring structure and the pad pattern may be substantially the same as described with reference to FIGS. 3F and 3G.

Then, processes the same as described with reference to FIG. 3F may be performed to form color filters 154 and micro lenses 156 on the second surface 101b in the first region of the first substrate 100a.

Figure 6:
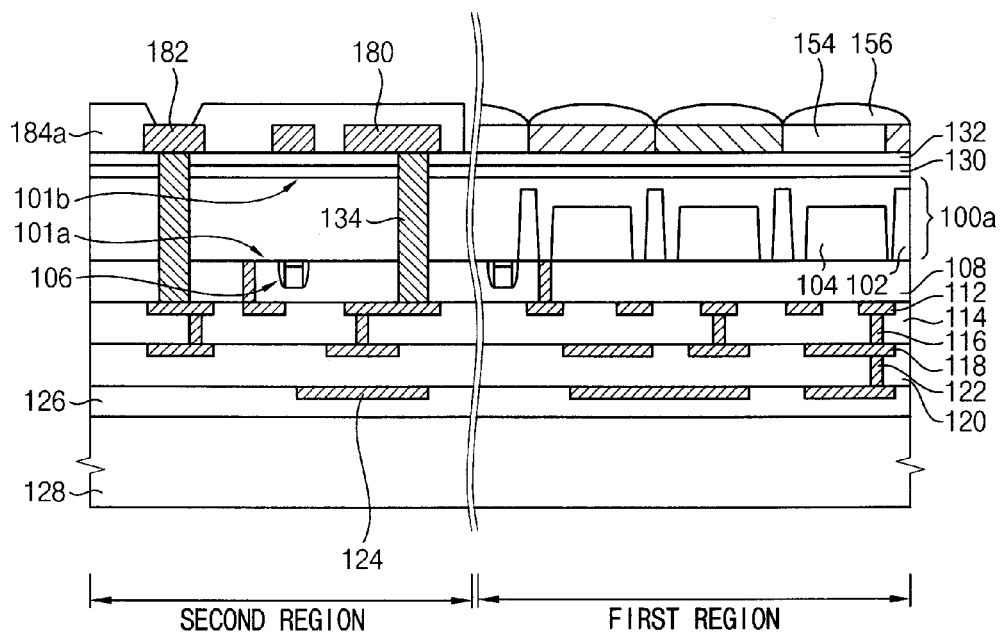

FIG. 6 is a cross-sectional view illustrating an image sensor having a backside illumination architecture in accordance with example embodiments.

The image sensor of the present example embodiments may be substantially the same as described with reference to FIGS. 1, 2 and 3A-3H, except for a second wiring structure on a surface of a first substrate. Thus, the same reference numerals will be used to refer to the same or like elements as those described with reference to FIGS. 1, 2 and 3A-3H and any further repetitive explanation concerning the above elements will be omitted.

Referring to FIG. 6, an image sensor having a backside illumination architecture may include photodiodes 104 in a first substrate 100a. Color filters 154, micro lenses 156, a second insulation interlayer structure 184a and a second wiring structure 180 may be provided on a second surface 101b such as a backside of the first substrate 100a. A first insulation interlayer structure and a first wiring structure may be provided on a first surface 101a of the first substrate 100a. A via contact plug 134 may be provided to penetrate the first substrate 100a to electrically connect the first and second wiring structures. The pad pattern 182 may be provided to be electrically connected to the second wiring structure and the first wiring structure. An external electrical signal may be applied through an exposed upper surface of the pad pattern.

As illustrated in the figure, the photodiodes 104 may be provided between the first and second wiring structures.

The via contact plug 134 may extend from the second surface 101b to penetrate the first substrate 100a to be connected to the first wiring structure. The via contact plug 134 may penetrate the second region of the first substrate 100a.

The second insulation interlayer structure 184a may be provided on the second surface 101b in the second region of the first substrate 100a.

The second wiring structure 180 may be provided in the second insulation interlayer structure 184a, to be electrically connected to the via contact plug 134. At least a portion of the second wiring structure 180 may make contact with the via contact plug 134. The second wiring structure 180 may include a single-layered wiring line. That is, upper wiring lines that are connected through a contact may not be provided on the second surface 101b in the second region of the first substrate 100a.

The pad pattern 182 may be electrically connected to the via contact plug 134. That is, at least a portion of the pad pattern 182 may make contact with the via contact plug 134. Accordingly, the pad pattern 182 may be electrically connected to the second wiring structure 180 and the first wiring structure. In case that the second wiring structure 180 includes a single-layered wiring line, the upper surface of the pad pattern 182 may have the same height as the uppermost surface of the second wiring structure 180.

As illustrated in the figure, the second wiring structure 180 may be covered with the second insulation interlayer structure 184a. On the other hand, the pad pattern 182 may be used as a terminal electrode to which an external electrical signal is applied. Accordingly, the upper surface of the pad pattern 182 may not be covered with the second insulation interlayer structure.

A method of manufacturing the image sensor having a backside illumination architecture in FIG. 6 may be substantially the same as described with reference to FIGS. 1, 2 and 3A-3H, except for a step of forming a single-layered second wiring structure on a second surface of a first substrate and a step of forming a pad pattern to make contact with a via contact plug.

Figure 7:
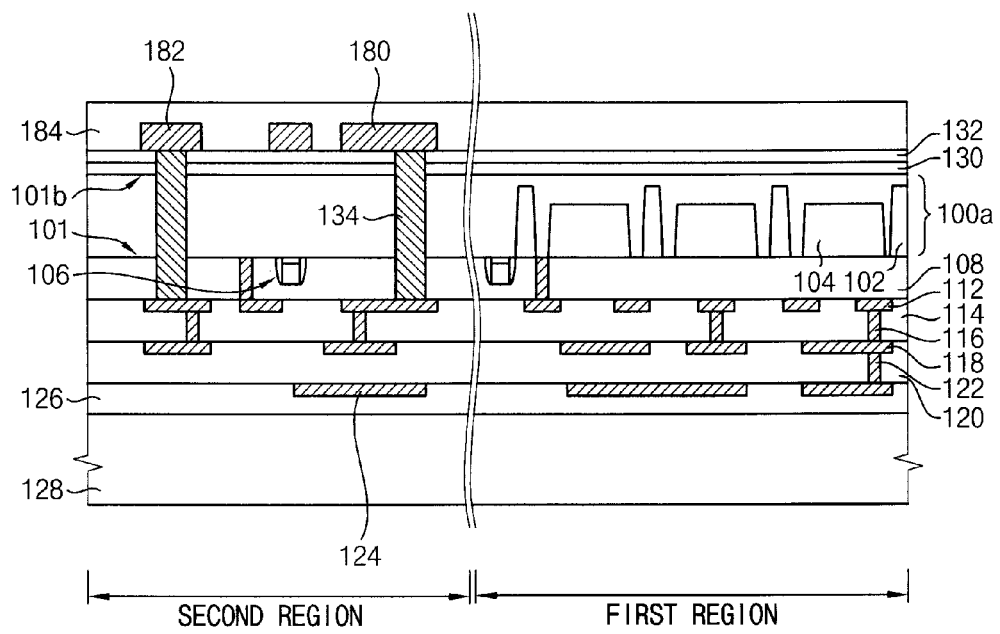

FIG. 7 is a cross-sectional view illustrating a method of manufacturing the image sensor having a backside illumination architecture in FIG. 6.

First, processes the same as described with reference to FIGS. 3A to 3E may be performed to form the structure in FIG. 3E.

Referring to FIG. 7, an upper wiring line 180 and pad patterns 182 may be formed on a second surface of a first substrate 100a to be electrically connected to a via contact plug 134. The pad pattern 182 may be formed to make contact with the via contact plug 134. The upper wiring line 180 may be formed such that at least a portion of the upper wiring line 180 may make contact with the via contact plug 134. The upper wiring line 180 may be used as a second wiring structure. That is, the second wiring structure 180 may include a single-layered wiring line.

An insulation interlayer 184 may be formed to cover the second wiring structure 180 and the pad pattern 182.

Then, processes the same as described with reference to FIGS. 3G and 3H may be performed to form the image sensor having a backside illumination architecture in FIG. 6.

Figure 8:
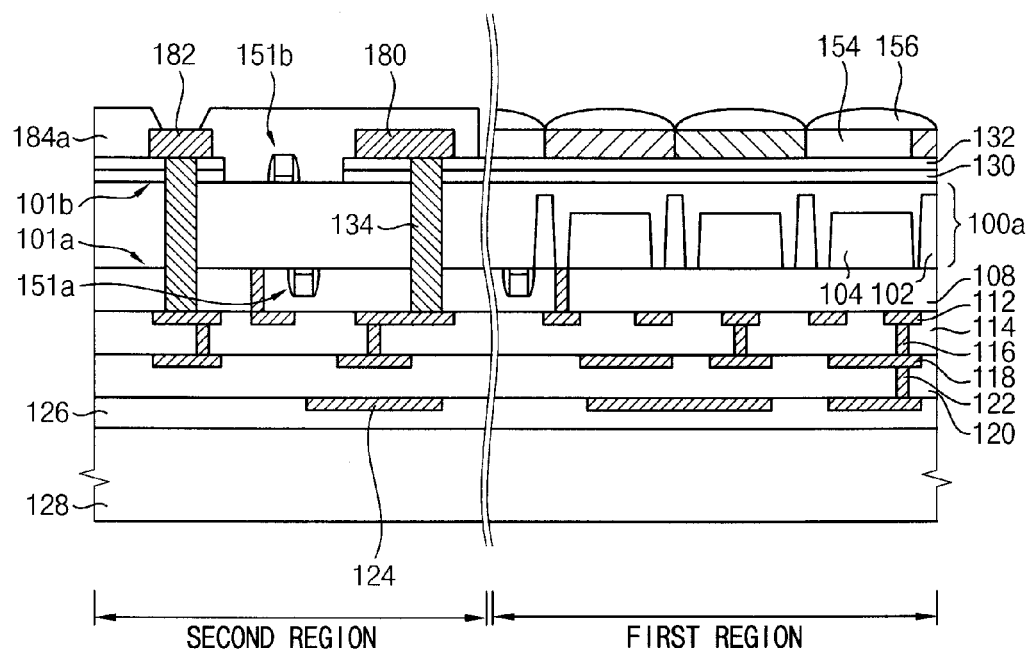

FIG. 8 is a cross-sectional view illustrating an image sensor having a backside illumination architecture in accordance with example embodiments.

The image sensor of the present example embodiments may be substantially the same as described with reference to FIGS. 6 and 7, except for an arrangement of transistors for peripheral circuits. Thus, the same reference numerals will be used to refer to the same or like elements as those described in FIGS. 6 and 7, and any further repetitive explanation concerning the above elements will be omitted.

Referring to FIG. 8, an image sensor having a backside illumination architecture may include transistors that are provided on a first surface 101a and a second surface 101b, respectively.

A transmission transistor, a reset transistor, a conversion transistor and a selection transistor included in a unit pixel may be provided on the first surface 101a in the first region of the first substrate 100a. First transistors 151a for peripheral circuits may be provided on the first surface 101a in the second region of the first substrate 100a.

Second transistors 151b for peripheral circuits may be provided on the second surface 101b in the second region of the first substrate 100a.

As mentioned above, the transistors for peripheral circuits may be provided on the first and second surfaces 101a, 101b of the first substrate 100a, respectively. On the other hand, the transistors may not be provided on the second surface 101b in the first region of the first substrate 100a.

In the present example embodiments, the image sensor may include the transistors for peripheral circuits that are provided on the second surface 101b of the first substrate 100a. Accordingly, an area for the wirings to be formed may be increased to thereby simplify layout design.

A method of manufacturing the image sensor having a backside illumination architecture in FIG. 8 may be substantially the same as in FIGS. 4 and 5A-5C, except for a step of forming a single-layered second wiring structure on a second surface of a first substrate and a step of forming a pad pattern to make contact with a via contact plug.

Figure 9:
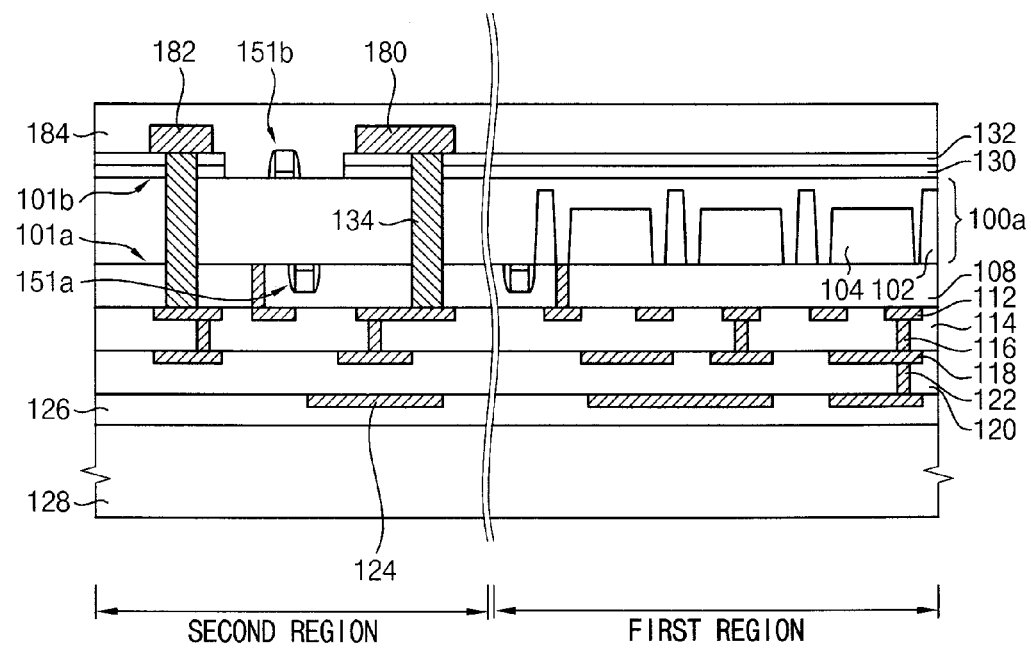

FIG. 9 is a cross-sectional view illustrating a method of manufacturing the image sensor having a backside illumination architecture in FIG. 8.

First, processes the same as described with reference to FIGS. 3A to 3D, 5A and 5B may be performed to form the structure in FIG. 5B.

Referring to FIG. 9, an upper wiring line 180 and pad patterns 182 may be formed on a second surface of a first substrate 100a to be electrically connected to a via contact plug 134. At least a portion of the pad pattern 182 may be formed to make contact with the via contact plug 134. The upper wiring line 180 may be formed such that at least a portion of the upper wiring line 180 may make contact with the via contact plug 134. The upper wiring line 180 may be used as a second wiring structure. That is, the second wiring structure 180 may include a single-layered wiring line.

An insulation interlayer 184 may be formed to cover the second wiring structure 180 and the pad pattern 182.

Then, processes the same as described with reference to FIGS. 3G and 3H may be performed to form the image sensor having a backside illumination architecture in FIG. 8.

Figure 10:
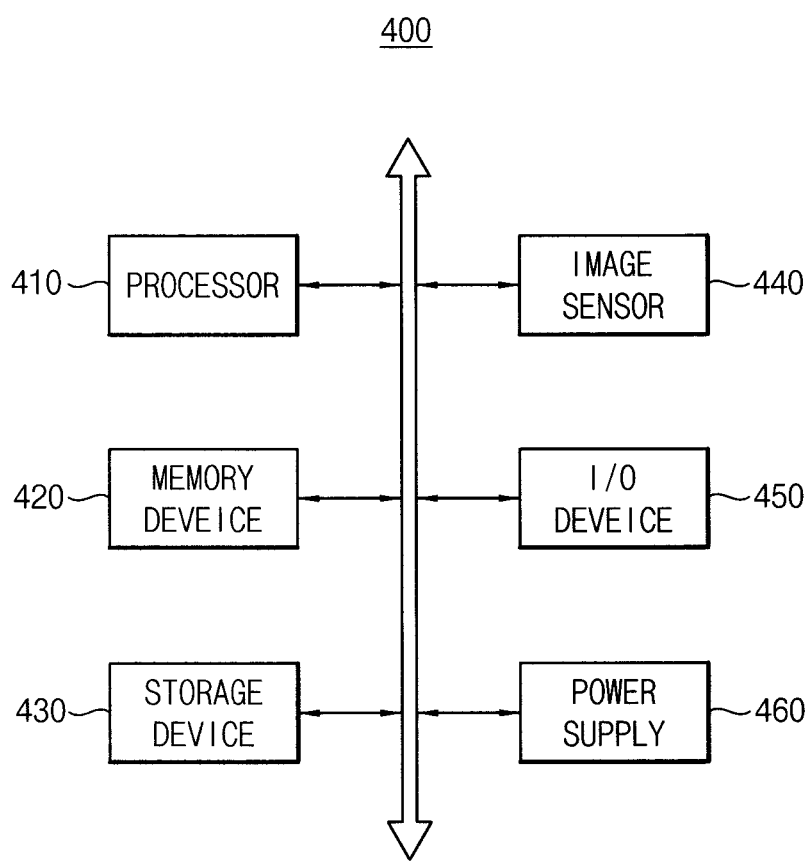

FIG. 10 is a block diagram illustrating a system including an image sensor in accordance with example embodiments.

Referring to FIG. 10, a system 400 may include a processor 410, a memory device 420, a storage device 430, an image sensor 440, an input/output (I/O) device 450 and a power supply 460. Although it is not illustrated in the figure, the system 400 may further include a port that may be coupled with a video card, a sound card, a memory card, a USB device, or the like, or other systems.

The processor 410 may perform specific calculations or tasks. For example, the processor 410 may be a central processing unit (CPU). The processor 410 may communicate with the memory device 420, the storage device 430 and the I/O device 450 via an address bus, a control bus, a data bus, or the like. The processor 410 may be connected to an expanded bus (e.g., peripheral component interconnect (PCI) bus).

The storage device 430 may include solid state drive, hard disk drive, CD-ROM, etc. The I/O device 450 may include an input device (e.g., keyboard, keypad, mouse, or the like) and an output device (e.g., printer, display, or the like). The power supply 460 may supply an operation voltage required for operation of the system 400.

The image sensor 440 may be connected to processor 410 via the buses or other communication links. The image sensor 440 may include an image sensor according to example embodiments in FIGS. 1 through 5A-5C.

The image sensor 440 may be mounted with the processor 410 to form one chip. Alternatively, the image sensor 440 and the processor 410 may be mounted separately to each other to form different chips. The system 400 may be an electronic system including the image sensor according to example embodiments.

As mentioned above, the image sensor having a backside illumination architecture may have a simple wiring structure. The image sensor according to example embodiments may be applied to computer, digital camera, 3D-camera, mobile phone, PDA, scanner, navigation, video phone, monitor system, auto-focus system, image stabilizer system, etc.

The foregoing is illustrative of example embodiments and is not to be construed as limiting thereof. Although a few example embodiments have been described, those skilled in the art will readily appreciate that many modifications are possible in example embodiments without materially departing from the novel teachings and advantages of the present invention. Accordingly, all such modifications are intended to be included within the scope of example embodiments as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. An image sensor, comprising:
a first insulation interlayer structure on a first surface of a first substrate and having a multi-layered structure;
a first wiring structure in the first insulation interlayer structure;
a via contact plug extending from a second surface of the first substrate opposite to the first surface and penetrating the first substrate to be electrically connected to the first wiring structure;
a plurality of color filters and a plurality of micro lenses stacked on the second surface in a first region of the first substrate;
a second insulation interlayer structure on the second surface in a second region of the first substrate;
a second wiring structure in the second insulation interlayer structure to be electrically connected to the via contact plug;
a pad pattern electrically connected to the second wiring structure and having an upper surface through which an external electrical signal is applied; and
a plurality of photodiodes between the first and second wiring structures in the first region of the first substrate and corresponding to each of the plurality of micro lenses.

2. The image sensor of claim 1, further comprising:
a second substrate adhered to the first insulation interlayer structure to support the first insulation interlayer structure.

3. The image sensor of claim 1, wherein the upper surface of the pad pattern has a height the same as, or higher than, an uppermost surface of the second wiring structure.

4. The image sensor of claim 1, wherein the pad pattern contacts a portion of the second wiring structure.

5. The image sensor of claim 1, wherein the pad pattern contacts a portion of the via contact plug.

6. The image sensor of claim 1, wherein the second wiring structure includes a plurality of single-layered or multi-layered metal wirings each including a contact plug and a wiring line.

7. The image sensor of claim 1, further comprising:
a plurality of transistors on the first surface of the first substrate, wherein the plurality of transistors are electrically connected to the first wiring structure and constitute a plurality of first peripheral circuits and a plurality of image pixels.

8. The image sensor of claim 7, further comprising:
a plurality of additional transistors on the second surface in the second region of the first substrate, wherein the plurality of additional transistors are electrically connected to the second wiring structure and constitute a plurality of second peripheral circuits.

9. The image sensor of claim 1, wherein the first wiring structure covers the entire first surface of the first substrate and has a multi-layered structure.

10. An image sensor, comprising:
a first wiring structure on a first surface of a first substrate;
a via contact plug extending from a second surface of the first substrate opposite to the first surface and penetrating the first substrate to be electrically connected to the first wiring structure;
a plurality of color filters and a plurality of micro lenses stacked on the second surface in a first region of the first substrate;
a second wiring structure on the second surface in a second region of the first substrate to be electrically connected to the via contact plug;
a pad pattern electrically connected to the second wiring structure and having an upper surface through which an external electrical signal is applied; and
a plurality of photodiodes between the first and second wiring structures in the first region of the first substrate.

11. The image sensor of claim 10, wherein the first wiring structure is covered with a first insulation interlayer structure, and the second wiring structure is covered with a second insulation interlayer structure.

12. The image sensor of claim 10, wherein the second wiring structure includes a plurality of multi-layered metal wirings each including a contact plug and a wiring line, and the pad pattern contacts at least a portion of the second wiring structure.

13. The image sensor of claim 10, wherein the second wiring structure includes a single-layered metal wiring having a wiring line, and the single-layered metal wiring is coplanar with the pad pattern.

14. The image sensor of claim 13, wherein at least a portion of the single-layered metal wiring contacts the via contact plug.

15. The image sensor of claim 13, further comprising:
a plurality of transistors each on the first surface or the second surface of the first substrate.

16. An image sensor, comprising:
a first wiring structure on a first surface of a substrate;
a via contact plug extending through the substrate and electrically connected to the first wiring structure;
a plurality of color filters and a plurality of micro lenses stacked on a second surface in an active pixel region over the substrate, wherein the second surface opposes the first surface;
a second wiring structure on the second surface and electrically connected to the via contact plug, wherein the second wiring structure is in a region over the substrate excluding the active pixel region;
a pad pattern electrically connected to the second wiring structure and having an upper surface through which an external electrical signal is applied; and
a plurality of photodiodes between the first and second wiring structures in the active pixel region.

17. The image sensor of claim 16, further comprising:
a plurality of the via contact plugs each contacting either the pad pattern or the second wiring structure.

18. The image sensor of claim 17, further comprising:
at least one transistor on the second surface in the region over the substrate excluding the active pixel region,
wherein the at least one transistor is electrically connected to the second wiring structure.

19. The image sensor of claim 16, further comprising:
a plurality of insulation interlayers stacked on the second surface in the region over the substrate excluding the active pixel region,
wherein the second wiring structure includes a plurality of wiring lines each being in one of the plurality of insulation interlayers.

20. The image sensor of claim 19, further comprising:
at least transistor on the second surface in the region over the substrate excluding the active pixel region,
wherein the at least one transistor is electrically connected to the second wiring structure, and
the at least one transistor and the via contact plug are covered by a first insulation interlayer selected from the plurality of insulation interlayers.

* * * * *